US010749310B2

United States Patent
Haarlammert et al.

(10) Patent No.: US 10,749,310 B2
(45) Date of Patent: Aug. 18, 2020

(54) MOPA LASER SYSTEM WITH BACK REFLECTION PROTECTION

(71) Applicant: Fraunhofer-Gesellschaft zur Förderung der angewandten Forschung e. V., Munich (DE)

(72) Inventors: Nicoletta Haarlammert, Jena (DE); Thomas Schreiber, Jena (DE)

(73) Assignee: Fraunhofer-Gesellschaft Zur Forderung Der Angewandten Forschung E.V., Munich (DE)

( * ) Notice: Subject to any disclaimer, the term of this patent is extended or adjusted under 35 U.S.C. 154(b) by 0 days.

(21) Appl. No.: 16/468,841

(22) PCT Filed: Dec. 15, 2017

(86) PCT No.: PCT/EP2017/083090
§ 371 (c)(1),
(2) Date: Jun. 12, 2019

(87) PCT Pub. No.: WO2018/109182
PCT Pub. Date: Jun. 21, 2018

(65) Prior Publication Data
US 2020/0091674 A1    Mar. 19, 2020

(30) Foreign Application Priority Data
Dec. 15, 2016   (DE) .................. 10 2016 124 490

(51) Int. Cl.
*H01S 3/10*       (2006.01)
*H01S 3/23*       (2006.01)
(Continued)

(52) U.S. Cl.
CPC .......... *H01S 3/2308* (2013.01); *H01S 3/0064* (2013.01); *H01S 3/0078* (2013.01);
(Continued)

(58) Field of Classification Search
CPC .... H01S 3/2308; H01S 3/0064; H01S 3/0078; H01S 3/10023; H01S 3/067;
(Continued)

(56) References Cited

U.S. PATENT DOCUMENTS

2004/0213302 A1*  10/2004  Fermann ................. H01S 3/106
                                                                  372/6
2010/0296529 A1*  11/2010  Andersen .............. H01S 3/1118
                                                                  372/6

(Continued)

*Primary Examiner* — Kinam Park
(74) *Attorney, Agent, or Firm* — Raymond R. Ferrera; Adams and Reese LLP

(57) ABSTRACT

The invention relates to a MOPA laser system having at least one laser oscillator (MO), which generates laser radiation at an emission wavelength ($\lambda_o$), and having an optical amplifier (PA) downstream the laser oscillator (MO) in the propagation direction of the laser radiation, which optical amplifier amplifies the laser radiation and thereby spectrally broadens it to a useful bandwidth ($\Delta\lambda$). It is an object of the invention to provide an improved MOPA laser system which is designed for a high power of the amplified laser radiation and which is insensitive to back-reflection. Unavoidable back-reflections should neither affect the output power of the optical amplifier (PA), nor lead to the destruction of the laser oscillator (MO) or other components of the system. This object is achieved by the invention in that an optical bandpass filter (BPF) is arranged between laser oscillator (MO) and amplifier (PA), which optical bandpass filter is transparent to laser radiation at the emission wavelength ($\lambda_o$), wherein those spectral components of the returning, that is, counter to the propagation direction, laser radiation impinging on the bandpass filter (BPF), which, in terms of wavelength, lie outside the passband (4), are reflected at the bandpass filter (BPF) in the propagation direction.

10 Claims, 1 Drawing Sheet

Figure 1:
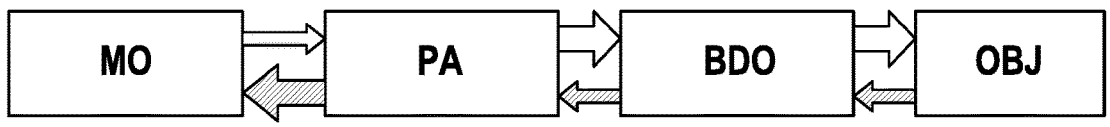

(51) Int. Cl.
  *H01S 3/00* (2006.01)
  *H01S 3/067* (2006.01)
  *H01S 5/00* (2006.01)
  *H01S 3/08* (2006.01)
  *H01S 5/50* (2006.01)

(52) U.S. Cl.
  CPC ...... *H01S 3/06754* (2013.01); *H01S 3/08027* (2013.01); *H01S 5/0078* (2013.01); *H01S 3/067* (2013.01); *H01S 3/10023* (2013.01); *H01S 5/5054* (2013.01)

(58) Field of Classification Search
  CPC ............ H01S 3/06754; H01S 3/08027; H01S 5/5054; H01S 5/0078
  See application file for complete search history.

(56) References Cited

U.S. PATENT DOCUMENTS

| | | | |
|---|---|---|---|
| 2011/0280262 A1* | 11/2011 | Fermann | H01S 3/1112 372/3 |
| 2015/0255942 A1* | 9/2015 | Fermann | H01S 3/0057 359/337 |
| 2017/0209959 A1* | 7/2017 | Popp | B23K 26/064 |

* cited by examiner

STAND DER TECHNIK

MOPA LASER SYSTEM WITH BACK REFLECTION PROTECTION

The invention relates to a laser system having at least one laser oscillator, which generates laser radiation at an emission wavelength, and having an optical amplifier (PA) downstream of the laser oscillator in the propagation direction of the laser radiation, which optical amplifier amplifies the laser radiation and thereby broadens it spectrally to a useful bandwidth.

The invention is in the field of generating high power laser radiation. A laser oscillator (also referred to as a "master oscillator") generates comparatively low power laser radiation at an emission wavelength. The generated laser radiation is supplied to an optical amplifier (also referred to as "power amplifier"), which increases the power of the laser radiation by a multiple. The entire system is also referred to as a MOPA system (combination of "Master Oscillator" and "Power Amplifier"). The optical amplification takes place by means of an optically pumped gain medium. In practice, fiber amplifiers are often used in which the laser radiation generated by the laser oscillator propagates through an optical fiber, the core of which is doped with rare earth ions. This amplifier fiber is optically pumped by means of a suitable pump light source, the light of which is also coupled into the amplifier fiber. So-called double-core or double-coated fibers are frequently used as reinforcing fibers. It is easily possible to amplify the laser radiation by a factor (ratio of output to input power) in the range of 2 to 10,000 and beyond using such MOPA systems.

An important application of such MOPA laser systems is laser-based material processing, for example, of metals. In this application, there is a problem in that part of the laser radiation impinging on the workpiece to be processed is reflected back into the optical amplifier. Such back-reflections are unavoidable, since the laser radiation must be focused on the reflective metallic workpiece for processing the surface. The back-reflections are amplified backwards in the optical amplifier, thereby extracting energy from the amplifier medium, so that the output power decreases in the forward direction. In addition, the back-reflected, amplified radiation can damage the laser oscillator, which is not designed for such high powers, or other components of the laser system.

Thus, there is a need for high gain MOPA laser systems that are insensitive to back-reflection.

It is known from the prior art (see for example, U.S. Pat. No. 7,715,664 B1) to use optical isolators designed for high power as protection against back-reflection in optical systems. Optical isolators are based on the rotation of the polarization in a suitable medium permeated by a magnetic field (Faraday effect), wherein the polarization rotation in and counter to the propagation direction of the laser radiation in the medium of the optical isolator takes place in the same direction. The optical isolator can be designed so that the laser radiation traveling counter to the propagation direction is rotated by 90° in polarization with respect to the laser radiation traveling in the propagation direction. The back-reflection can then be removed from the beam path by means of a polarization beam splitter, so that the back-reflected laser radiation can not get into the optical amplifier or the laser oscillator arranged in front of it. A disadvantage of using an optical isolator as reflex protection is that, due to the principle of operation, it can only be operated with polarized radiation. Thermal effects (thermal lenses) occur at the high power of the laser radiation, both in the necessary polarizers and in the medium of the optical isolator, the beam quality thereby suffering. A further disadvantage is that optical isolators are currently available only up to an average power of the laser radiation in the range of 100 W. There are, however, developments aimed at higher power in the kilowatt range. However, corresponding optical isolators are very complex and expensive.

Against this background, it is an object of the invention to provide an improved MOPA laser system which is designed for high power of the amplified laser radiation and which is insensitive to back-reflection. Unavoidable back-reflections should neither affect the output power of the optical amplifier, nor lead to the destruction of the laser oscillator or other components of the system.

This object is achieved by the invention on the basis of a laser system of the type specified above, characterized in that an optical bandpass filter is arranged between laser oscillator and amplifier, which bandpass filter is transparent to laser radiation at the emission wavelength, wherein the spectral passband of the bandpass filter is smaller than the useful bandwidth, wherein those spectral components of the returning, that is, counter to the propagation direction, laser radiation impinging on the bandpass filter, which, in terms of wavelength, lie outside the passband, are reflected at the bandpass filter in the propagation direction.

An essential element of the laser system according to the invention is the optical bandpass filter. The invention makes use of the fact that the laser radiation experiences a spectral broadening during amplification. The cause of this is non-linear effects occurring in the medium of the optical amplifier, such as the Kerr effect. The spectral broadening takes place in the medium of the optical amplifier and in further system-related components (for example, in a transport fiber connecting the laser oscillator to the gain medium), where the Kerr effect comes into play. Spectral broadening does not affect the efficiency of amplification. If there is a back-reflection, then the laser radiation traveling through the optical amplifier counter to the propagation direction has a (significantly) larger useful bandwidth compared to the laser beam generated by the laser oscillator. The back-reflected laser radiation is amplified and spectrally broadened in the optical amplifier (possibly even beyond the useful bandwidth), then impinges on the provided optical bandpass filter according to the invention, wherein those components of the back-reflected, amplified laser radiation, which lie outside the spectral passband of the bandpass filter, are reflected at the bandpass filter, after which these radiation components again, this time in the propagation direction, pass through the optical amplifier. In this case, the laser radiation experiences an amplification again and is available as useful radiation after passing through the optical amplifier.

The operating principle of the invention ensures that unavoidable back-reflections do not significantly impair the output power of the optical amplifier. Most of the back-reflected, amplified laser radiation is reflected at the optical bandpass filter and exits the system after again passing through the optical amplifier without causing damage.

The back-reflected laser radiation, however, also has spectral components in the passband of the bandpass filter. These components can pass the bandpass filter counter to the propagation direction and get into the laser oscillator. However, the relative proportion of the back-reflected, amplified laser radiation that can pass through the bandpass filter is comparatively small in terms of the relevant power. The ratio results from the factor of the spectral broadening of the laser radiation in the optical amplifier. The system should be designed so that the power of the laser radiation passing the bandpass filter in the direction counter to the propagation direction is sufficiently low, so that no damage occurs. The laser radiation passing the bandpass filter in the direction counter to the propagation direction gets into the resonator of the laser oscillator, is reflected at its rear reflector and then in turn leaves the laser oscillator in the propagation direction to be amplified in the amplifier and to contribute to the useful radiation. If this is to be avoided, an optical isolator of a conventional type can be provided between the laser oscillator and the bandpass filter, blocking the laser radiation passing through the bandpass filter counter to the propagation direction. An optical isolator designed for low power is sufficient in this case.

In a preferred embodiment of the laser system according to the invention, the spectral width of the passband of the bandpass filter is essentially equal to the spectral bandwidth of the laser radiation generated by the laser oscillator. It is thereby achieved that the entire spectrum of the laser radiation generated by the laser oscillator can pass the bandpass filter in the direction of the amplifier. This achieves maximum efficiency. At the same time, the passband should be optimally adapted to the spectrum of the laser radiation emitted by the laser oscillator such that no or only as little laser radiation as possible can pass through the bandpass filter outside the emission bandwidth of the laser oscillator. As a result, the proportion of the reflected-back, amplified laser radiation which can pass through the bandpass filter in the direction of the laser oscillator is minimized.

Ideally, the spectral width of the passband of the bandpass filter should not be greater than twice the emission bandwidth of the laser oscillator.

The useful bandwidth in the laser system according to the invention can be at least twice as large, preferably at least five times as large, particularly preferably at least ten times as large as the spectral bandwidth of the laser radiation generated by the laser oscillator. The invention utilizes, as explained above, the spectral broadening in the optical amplifier. The efficiency of the bandpass filter in suppressing the back-reflected, amplified laser radiation getting into the laser oscillator depends on the ratio of the useful bandwidth to the emission bandwidth of the laser oscillator, in which the passband of the bandpass filter is chosen essentially equal to the emission bandwidth of the laser oscillator. In fact, in practice, the suppression efficiency can be even better, since the back-reflected laser radiation is spectrally broadened as it passes through the optical amplifier, so that the back-reflected, amplified laser radiation impinging on the bandpass filter can have a bandwidth that is even greater than the useful bandwidth. The larger the spectral broadening, the more efficient the back-reflection protection. The spectral bandwidth of the laser radiation generated by the laser oscillator is preferably less than 0.01 nm up to 1 nm, wherein the useful bandwidth is at least 3 nm, preferably at least 10 nm. With a practical useful bandwidth of 10 nm and an emission bandwidth of the laser oscillator of 0.1 nm, the isolation achieved by the bandpass filter according to the invention compared to back-reflections is 20 dB. More importantly, more than 99% of the amplified back-reflections at the bandpass filter reflects in the propagation direction, amplifies in the optical amplifier, and then, when using the laser system according to the invention for material processing, again gets to the workpiece to be machined, which keeps the output power of the system stable.

It should be noted that the laser system according to the invention can not only have an optical amplifier, but also readily two or more series-connected optical amplifiers, as is quite common in known MOPA laser systems. The optical bandpass filter can equally be arranged between laser oscillator and the first optical amplifier as well as between two of the series-connected optical amplifiers. This does not change the functional principle. As far as the bandpass filter is arranged in the propagation direction in front of one of the optical amplifiers, it is arranged between laser oscillator and the amplifier in the sense of the invention.

In one possible embodiment of the laser system according to the invention, two or more laser oscillators are provided which generate laser radiation at a respectively different emission wavelength, wherein the bandpass filter has two or more passbands, the spectral positions and widths of which are adapted to the emission spectra of the laser oscillators, wherein a combination element is provided in the propagation direction in front of the amplifier, that the laser radiation of the two or more laser oscillators combines into a laser beam. In this embodiment, two or more (optionally phase-modulated) laser oscillators are provided which emit laser radiation at a respectively different emission wavelength. The radiation of the two or more laser oscillators is combined into a laser beam before the laser radiation is then optically amplified. A particularly efficient spectral broadening can be achieved in this embodiment by four-wave mixing (non-linear Kerr effect) in the optical amplifier, so that the isolation concept according to the invention can be particularly effective. However, in this embodiment, the bandpass filter must have two or more passbands adapted thereto, corresponding to the number of emission wavelengths.

In a preferred embodiment, the laser oscillator is coupled to an optical fiber and the amplifier is a fiber amplifier, wherein the bandpass filter is integrated into the fiber path between the output of the laser oscillator and the input of the amplifier. As a result, the MOPA laser system according to the invention can be realized completely fiber-based.

The bandpass filter can be formed very simply by two or more interference filters arranged one behind the other in the propagation direction, in particular fiber Bragg gratings. In this case, then the Bragg wavelengths, in which the fiber Bragg grating is transparent, lie outside the emission wavelength of the laser oscillator and within the useful bandwidth. Preferably, the Bragg wavelengths lie respectively above and below the emission wavelength of the laser oscillator. The bandwidth of the fiber Bragg gratings are then matched so that the arrangement according to the invention is transparent at the emission wavelength, wherein the passband is adapted as optimally as possible to the spectral bandwidth of the emission of the laser oscillator. The laser radiation is reflected at the arrangement of fiber Bragg gratings outside the passband, that is, both below and above the emission wavelength. In a corresponding manner, the bandpass filter, for example, for a free-jet realization, can be realized as a dielectric multilayer filter.

In a further preferred embodiment of the laser system according to the invention, the optical amplifier is power-modulated. Advantageously, the inventive concept for back-reflection isolation is compatible with a modulation of the power amplifier, which is required for material processing in the application. The modulation can be effected, for example, by modulation of the pump radiation supplied to the medium of the optical amplifier.

The advantages of the invention can be summarized as follows: the laser system enables the generation of high-power laser radiation based on the current and proven MOPA concept. Unavoidable back-reflections do not affect the output power during material processing. The destruction of the laser oscillator or other optical components of the laser system by back-reflections is prevented. The output power of the laser system can be modulated. The back-reflection protection achieved by the bandpass filter according to the invention can be realized simply and cost-effectively, for example, by fiber Bragg gratings. The back-reflection protection is completely achieved by passive components, that is, complex and expensive monitoring electronics and sensors are not needed.

Figure 2:
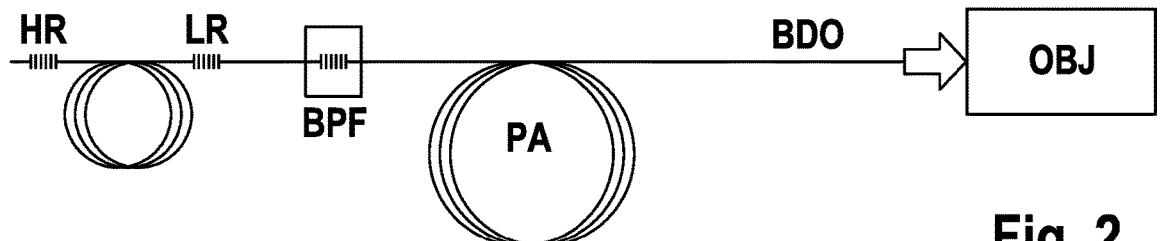
Figure 3:
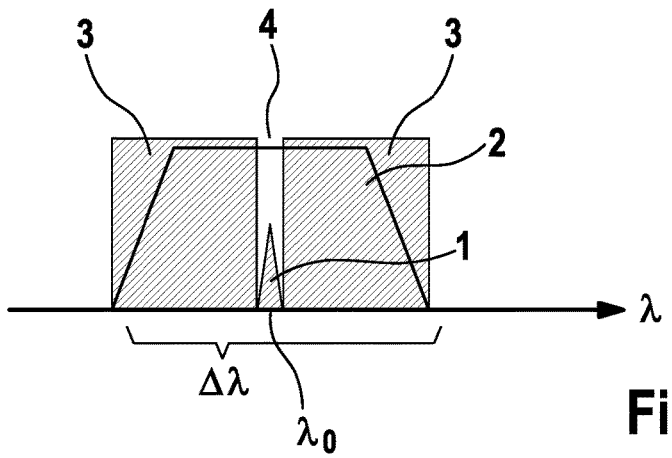
Figure 4:
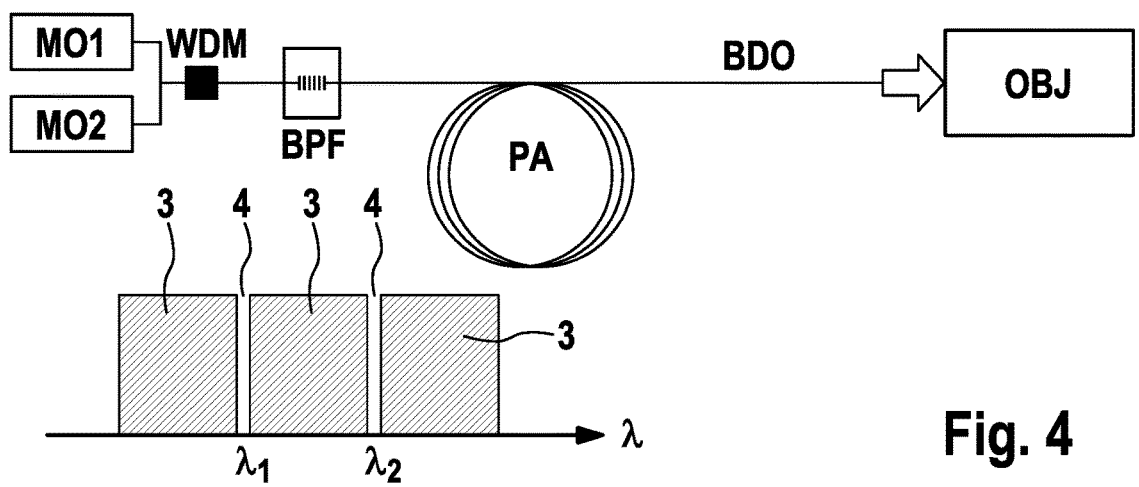

The invention is explained in mere detail below with reference to the drawings. Embodiments of the invention are shown schematically in the drawings. Shown are:

FIG. 1 MOPA laser system for material processing according to the prior art;

FIG. 2 a laser system according to the invention in a first embodiment;

FIG. 3 illustration of spectral properties of the optical bandpass filter according to the invention;

FIG. 4 laser system according to the invention in a second embodiment.

FIG. 1 schematically shows a MOPA laser system according to the prior art as a block diagram. The system comprises a laser oscillator MO which generates laser radiation at an emission wavelength. The generated laser radiation is supplied to an optical amplifier PA, which is, for example, an optically pumped, fiber amplifier doped with rare earth ions. The optical amplifier PA amplifies the laser radiation. At the same time, a nonlinear spectral broadening of the laser radiation to a useful bandwidth occurs in the optical amplifier PA, which broadening is typically significantly greater than the emission bandwidth of the laser oscillator. The amplified laser radiation travels in the propagation direction (indicated in FIG. 1 by the light arrows pointing to the right) through transmission optics ("beam delivery optics") BDO, until it gets to the workpiece OBJ to be processed. For example, the BDO transmission optics can be an optical transport fiber. This can be adapted with respect to dispersion to the other components of the laser system in order to achieve, for example, optimal pulse quality on the workpiece OBJ in the transmission of laser pulses. During machining, a part of the incident laser radiation is reflected at the workpiece OBJ. This is indicated by the dark, left-pointing arrows in FIG. 1. This back-reflected laser radiation passes through the system counter to the propagation direction. First, the back-reflected laser radiation passes through the transmission optics BDO and then the optical amplifier PA. The back-reflected laser radiation is amplified in the optical amplifier PA. The amplified back-reflected laser radiation then gets into the laser oscillator MO. Fluctuations in the output power of the laser system occur due to the amplification of the back-reflected laser radiation in the optical amplifier PA, since energy is extracted from the medium of the optical amplifier PA by the amplification of the back-reflected laser radiation. The amplified back-reflected laser radiation getting into the laser oscillator MO can cause damage there, since the optical components of the laser oscillator MO and other optical components, which are arranged in front of the optical amplifier PA, are not designed for high powers.

FIG. 2 schematically shows a MOPA laser system according to the invention. In this case, the laser oscillator MO is designed as a fiber oscillator. This comprises an optical fiber as a laser medium. A rear highly reflective grid HR and a front low reflective grid LR form the laser resonator. The laser radiation generated by the laser oscillator MO at the emission wavelength arrives at a fiber-integrated bandpass filter BPF over a fiber path. The bandpass filter BPF is transparent to the laser radiation at the emission wavelength both in and counter to the propagation direction, wherein the spectral bandpass of the bandpass filter smaller than the useful bandwidth on which the laser radiation in the subsequent optical amplifier PA is broadened compared to the emission bandwidth of the laser oscillator MO. Back-reflected laser radiation, that is, laser radiation propagating to the left from the workpiece OBJ in FIG. 2 through the transmission optics BDO and the fiber amplifier PA outside the passband of the bandpass filter, is reflected at the bandpass filter and then travels again in the propagation direction (to the right in FIG. 2) through the optical amplifier PA, is amplified in this and then gets through the transmission optics BDO back to the workpiece OBJ. In this way, the bandpass filter BPF effects an isolation against back-reflection. Back-reflections only get back into the laser oscillator MO in the passband of the bandpass filter which is narrow compared to the useful bandwidth. The power of this small proportion of the total back-reflected laser radiation is correspondingly low, so that no damage occurs in the laser oscillator. The laser radiation passing through the bandpass filter BPF in the back direction in the region of the emission wavelength is reflected at the rear reflector HR of the laser resonator of the laser oscillator MO and then likewise passes through the laser system in turn in the propagation direction. Optionally, an optical isolator of known design (not shown) designed for correspondingly small powers can be arranged between laser oscillator MO and BPF if it should be necessary to protect the laser oscillator as completely as possible against back-reflected radiation.

FIG. 3 illustrates the functional principle of the bandpass filter BPF according to the invention. The diagram shows the emission line 1 of the laser oscillator MO at the wavelength $\lambda_0$. Reference numeral 2 denotes the spectrum of the laser radiation amplified in the optical amplifier PA and spectrally broadened to the useful bandwidth $\Delta\lambda$. Reference numeral 3 denotes the reflection spectrum of the bandpass filter BPF. It can be seen that the bandpass filter BPF has a passband 4 adapted to the emission line 1 of the laser oscillator MO. The laser radiation is reflected at the bandpass filter BPF outside the passband 4. On the basis of the overlap of the spectrum 2, which corresponds to the spectrum of the back-reflected laser radiation, with the reflection spectrum 3, it becomes clear that the majority of the back-reflected laser radiation is reflected at the bandpass filter BPF and thus can not arrive at the laser oscillator MO.

FIG. 3 schematically shows the spectral properties of the radiation and the bandpass filter. It should be noted that the spectral characteristics of the bandpass filter BPF can also be asymmetric in adaptation to the occurring spectra of the laser radiation, for example, when the non-linear spectral broadening mechanism of the optical amplifier PA is asymmetric to the emission wavelength $\lambda_0$ (for example, in Raman processes). In any case, the bandpass filter should be adapted as far as possible to the bandwidth and spectral position of the back-reflected laser radiation, insofar as these differ from the spectrum of the laser radiation of the laser oscillator.

A fiber laser can be used as a laser oscillator MO, as illustrated in FIG. 2. In principle, however, any CW or pulsed laser or a light-emitting diode (LED) of low bandwidth can be considered. The laser oscillator can be amplitude and/or phase modulated. The master oscillator MO can also be an ASE source which amplifies electromagnetic radiation resulting from spontaneous emission and optionally spectrally truncates it.

In the exemplary embodiment shown in FIG. 4, two laser oscillators MO1, MO2 are provided which generate laser radiation at a different emission wavelength. The laser oscillator MO1 has the emission wavelength $\lambda_1$, the laser oscillator MO2 has the emission wavelength $\lambda_2$. The laser radiation of the two laser oscillators MO1, MO2 is combined by means of a combination element WDM into a single laser beam, which then, as in FIG. 2, propagates through an optical fiber to the bandpass filter BPF according to the invention.

FIG. 4 schematically shows the reflection spectrum of the bandpass filter BPF in this exemplary embodiment. It can be seen that the bandpass filter BPF has two narrow passbands 4 at the emission wavelengths $\lambda_1$, $\lambda_2$. The laser radiation is reflected at the bandpass filter BPF in the remaining regions 3. The emission at two different wavelengths $\lambda_1$, $\lambda_2$ can be utilized in order to broaden the bandwidth of the laser radiation to the useful bandwidth in the optical amplifier PA via four-wave mixing in a particularly efficient manner. The two laser oscillators MO1, MO2 can preferably be phase modulated to suppress further undesired effects, such as stimulated Brillouin scattering. Suitable narrowband sources as laser oscillators MO1, MO2 can be easily realized as diode lasers with external resonator (ECDL) or as spectrally truncated ASE sources.

The invention claimed is:

1. A laser system comprising at least one laser oscillator (MO), wherein said laser oscillator generates laser radiation at an emission wavelength ($\lambda_0$), and at least one optical amplifier (PA) downstream of the laser oscillator (MO) in the propagation direction of the laser radiation, wherein said optical amplifier amplifies the laser radiation and thereby spectrally broadens it to a useful bandwidth ($\Delta\lambda$), wherein said laser system further comprises:
   an optical bandpass filter (BPF) arranged between said laser oscillator (MO) and said optical amplifier (PA), wherein said optical bandpass filter is transparent to laser radiation at the emission wavelength ($\lambda_0$), and a spectral passband of the optical bandpass filter is smaller than the useful bandwidth ($\Delta\lambda$),
   wherein those spectral components of the returning, that is, counter to the propagation direction, laser radiation impinging on the bandpass filter (BPF), which, in terms of wavelength, lie outside the passband, are reflected at the bandpass filter (BPF) in the propagation direction.

2. The laser system according to claim 1, wherein the passband of the bandpass filter (BPF) is essentially equal to the spectral bandwidth of the laser radiation generated by the laser oscillator (MO).

3. The laser system according to claim 2, wherein the useful bandwidth ($\Delta\lambda$) is at least twice as large, preferably at least five times as large, more preferably at least ten times as large as the spectral bandwidth of the laser radiation generated by the laser oscillator (MO).

4. The laser system according to claim 3, wherein the spectral bandwidth of the laser radiation generated by the laser oscillator (MO) is less than 0.01 nm to 1 nm, wherein the useful bandwidth ($\Delta\lambda$) is at least 3 nm.

5. The laser system according to claim 1, wherein two or more laser oscillators (MO1, MO2) are provided, which generate laser radiation at a respectively different emission wavelength ($\lambda_1$, $\lambda_2$), wherein the bandpass filter (BPF) has two or more passbands, the spectral positions and widths of which are adapted to the emission spectra of the laser oscillators (MO1, MO2), wherein a combination element (WDM) is provided in the propagation direction in front of the amplifier (PA), the combination element combining the laser radiation of the two or more laser oscillators (MO1, MO2) into a laser beam.

6. The laser system according to claim 1, wherein the laser oscillator (MO) is coupled to an optical fiber and the amplifier (PA) is a fiber amplifier, wherein the bandpass filter (BPF) is integrated into the fiber path between the output of the laser oscillator (MO) and the input of the amplifier (PA).

7. The laser system according to claim 6, wherein the bandpass filter (BPF) is formed by two or more fiber Bragg gratings arranged one behind the other in the propagation direction, the Bragg wavelengths of which lie outside the emission wavelength ($\lambda_0$) of the laser oscillator (MO) and within the useful bandwidth ($\Delta\lambda$).

8. The laser system according to claim 1, wherein the bandpass filter (BPF) is a dielectric multilayer filter.

9. The laser system according to claim 1, wherein the amplifier (PA) is power-modulated.

10. The laser system according to claim 3, wherein the spectral bandwidth of the laser radiation generated by the laser oscillator (MO) is less than 0.01 nm to 1 nm, wherein the useful bandwidth ($\Delta\lambda$) is at least 10 nm.

* * * * *